(12) United States Patent
Vandervorst et al.

(10) Patent No.: US 10,014,178 B2
(45) Date of Patent: Jul. 3, 2018

(54) METHOD FOR DIFFERENTIAL HEATING OF ELONGATE NANO-SCALED STRUCTURES

(71) Applicant: IMEC VZW, Leuven (BE)

(72) Inventors: Wilfried Vandervorst, Mechelen (BE); Janusz Bogdanowicz, Brussels (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 15/354,489

(22) Filed: Nov. 17, 2016

(65) Prior Publication Data

US 2017/0178910 A1    Jun. 22, 2017

(30) Foreign Application Priority Data

Dec. 21, 2015  (EP) ..................... 15201473

(51) Int. Cl.
*H01L 21/00* (2006.01)
*H01L 21/268* (2006.01)
*H01L 21/8234* (2006.01)
*H01L 21/225* (2006.01)
*H01L 29/06* (2006.01)
*H01L 21/02* (2006.01)

(52) U.S. Cl.
CPC ...... *H01L 21/268* (2013.01); *H01L 21/02667* (2013.01); *H01L 21/225* (2013.01); *H01L 21/823431* (2013.01); *H01L 29/0665* (2013.01); *H01L 21/2252* (2013.01); *H01L 21/2258* (2013.01)

(58) Field of Classification Search
CPC ............ H01L 21/268; H01L 21/02667; H01L 21/225; H01L 21/823431; H01L 21/2258
See application file for complete search history.

(56) References Cited

U.S. PATENT DOCUMENTS

| 6,630,386 | B1 | 10/2003 | Yu |
| 7,786,024 | B2 * | 8/2010 | Stumbo ................ B23K 26/073 438/795 |
| 2009/0023262 | A1 | 1/2009 | Jin et al. |
| 2014/0159165 | A1 | 6/2014 | Van Dal et al. |
| 2015/0021746 | A1 | 1/2015 | Theodore |
| 2015/0111359 | A1 | 4/2015 | Tsai et al. |

* cited by examiner

*Primary Examiner* — Richard Booth
(74) *Attorney, Agent, or Firm* — McDonnell Boehnen Hulbert & Berghoff LLP

(57) ABSTRACT

The present disclosure is related to a method of fabricating a semiconductor device involving the production of at least two non-parallel nano-scaled structures on a substrate. These structures are heated to different temperatures by exposing them simultaneously to polarized light having a wavelength and polarization such that a difference in absorption of light occurs in the first and second nanostructure. In some cases the light is polarized in a plane that is parallel to one of the structures. The present disclosure may provide differential heating of semiconductor structures of different materials, such as Ge and Si fins.

16 Claims, 2 Drawing Sheets

METHOD FOR DIFFERENTIAL HEATING OF ELONGATE NANO-SCALED STRUCTURES

CROSS-REFERENCE TO RELATED APPLICATIONS

The present application is a non-provisional patent application claiming priority to European Patent Application No. EP 15201473.4, filed Dec. 21, 2015, the contents of which are hereby incorporated by reference.

FIELD OF THE DISCLOSURE

The present disclosure is related to semiconductor processing, in particular to heating steps taking place during such processing, as applied for example for dopant activation annealing or recrystallization annealing.

BACKGROUND

Processing parameters for heating of nano-scaled structures may be based on the material of the structures. For example, the formation of Si and Ge transistors (or III-V) on the same wafer poses a problem of the dopant anneal which requires very different temperatures for the Si junctions and Ge-junctions. Applying the higher temperature required for (strained) Si will negatively influence the Ge-junctions (and strain). Staying at the lower temperature required for Ge leads to poor activation for Si-based junctions. It is challenging, therefore, to utilize CMOS processes for substrates that include both Si and Ge devices.

SUMMARY

This disclosure is related to a method as disclosed in the appended claims. This disclosure is related to a method of fabricating a semiconductor device involving the production of at least two non-parallel elongate nano-scaled structures on a substrate. These structures are heated to different temperatures by exposing them simultaneously to polarized light having a wavelength and polarization such that a difference in absorption of light occurs in the first and second nanostructure. In some examples, the light is polarized in a plane that is parallel to one of the structures. Examples disclosed herein may be particularly useful for the differential heating of semiconductor structures of different materials, such as Ge and Si fins. The claimed method is a method for fabricating a semiconductor device, which may be an integrated circuit chip. The method steps identified in the claims are relative to particular substeps of the fabrication process. Steps not explicitly stated in the claims can be performed according to processes known in the art. The term "nano-scaled" means that at least the transversal dimension of the structure is of the order of nanometers or tens of nanometers, e.g. a fin with a width between 10 and 40 nm.

The present disclosure is thus related to a method for manufacturing a semiconductor device, the method comprising: providing a semiconductor substrate; producing on the substrate at least one first elongate nanostructure oriented along a first axis and at least one second elongate nanostructure oriented along a second axis, the two axes being differently oriented one to the other; and heating the elongate nanostructures, wherein the structures are heated to different temperatures by applying light having a wavelength and having a polarization such that a difference in absorption of light occurs in the first and second nanostructure.

According to an embodiment, the first and second axes are perpendicular with respect to each other.

According to a further embodiment, the polarization plane is parallel to the first or second axis.

According to an embodiment, the first nanostructure comprises a different material than the material of the second nanostructure.

According to an embodiment, the first and second structures are semiconductor fins comprising mutually different semiconductor materials.

According to an embodiment, the semiconductor materials are chosen from the list consisting of Si, Ge, SiGe, III-V material.

According to an embodiment, the nanostructures are nanotubes, nanowires or nanofibers.

According to an embodiment, the wavelength of the light is between 10 and 30 times the width of the elongate structures. According to another embodiment, the wavelength of the light is between 157 nm and 1060 nm.

According to an embodiment, the heating is applied for activating dopant elements implanted in the nanostructures.

According to an embodiment, the heating is applied for recrystallization of the nanostructures.

According to an embodiment, a single heating step is applied. According to another embodiment, multiple heating steps are applied, and the substrate is rotated relative to the polarization plane or vice versa, in between the heating steps.

DETAILED DESCRIPTION

Figure 1:
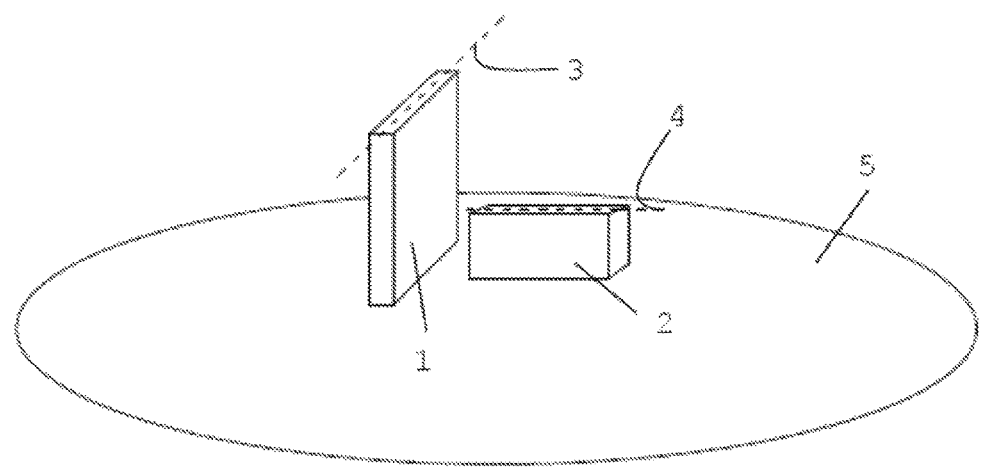
FIG. 1 illustrates a configuration of nano-scaled fin-shaped structures according to an example embodiment of the present disclosure.

FIG. 1 illustrates a pair of elongate nanostructures according to an embodiment of the present disclosure. These are nano-scaled semiconductor fins 1 and 2, oriented along first and second longitudinal axes 3 and 4, the axes being perpendicular with respect to one another. The fins are produced on a semiconductor substrate 5, by any method suitable for this purpose. In some examples, a first row of evenly spaced fins is produced, each fin oriented along the first axis 3, and a second row oriented along the second axis 4. The dimensions of the fins are of the order of nanometers, e.g. fins of 20 nm wide and 300 nm high. These dimensions are common in present-day processing of fins for the production of FinFET transistors.

Figure 2A:
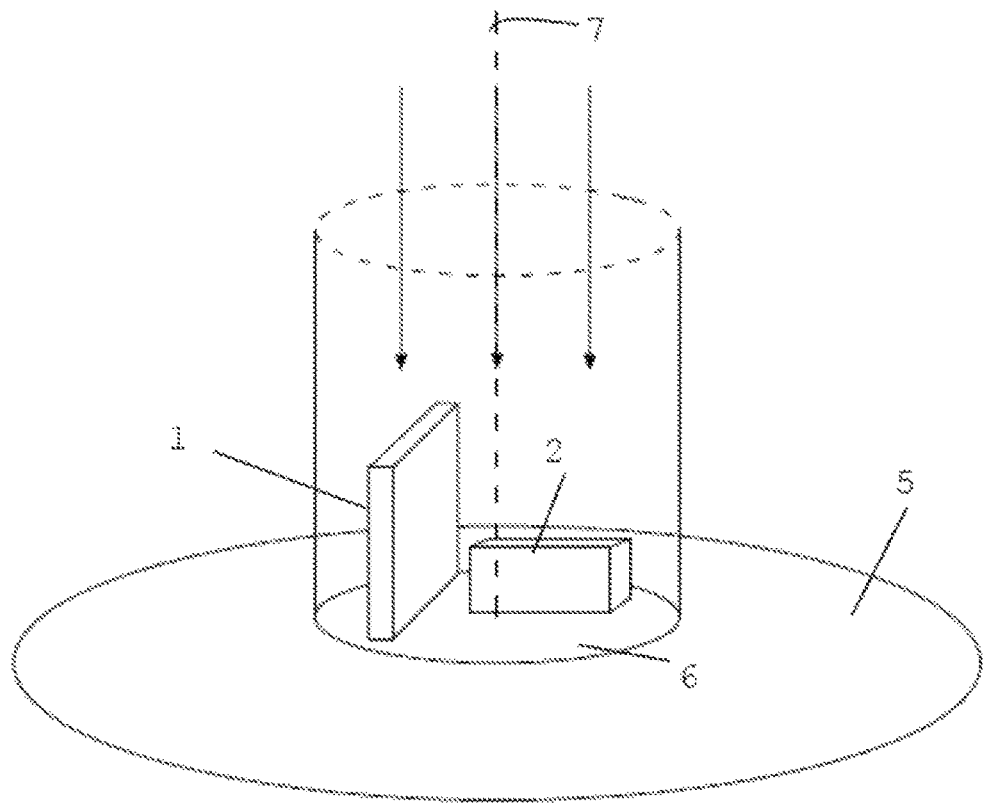
FIG. 2a illustrates the heating of the structures of FIG. 1 by polarized light.
Figure 2B:
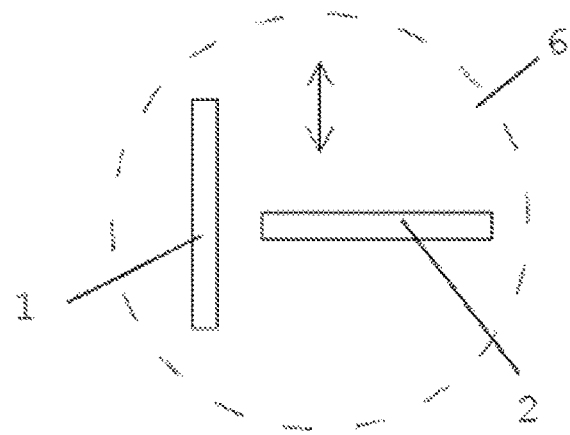
FIG. 2b shows the polarization angle of incident light relative to the orientation of the nanostructures.

Example methods of the present disclosure involve the heating of these structures in a single heating step, in such a manner that one structure is heated to a higher temperature than the other. This is done by exposing the fins to light of a given wavelength and polarization, as illustrated in FIG. 2a. In some examples, laser light is used. The light is directed at a spot 6 which comprises the two fins 1 and 2. In some examples, the light is directed perpendicularly to the substrate 5. The light is linearly polarized, i.e. the light is characterized as electromagnetic oscillations in a well-defined plane that is perpendicular to the direction of incidence of the beam, determined for example by the central axis 7 of a bundle of laser beams directed at the spot 6. In some embodiments, the light is polarized in a plane that is parallel to the longitudinal direction of one of the fins 1 or 2. This embodiment is illustrated in the plane view shown in FIG. 2b. The double arrow indicates the polarization plane of the incident light. The polarization plane is parallel to the first fin 1, and because of the orientation of the second fin 2, the polarization plane is perpendicular to this second fin 2. Polarization of the light may be achieved by polarization filters.

The relative position of the polarization plane of incident light with respect to the orientation of an elongate structure can have an important influence on the coupling of this light into the structure. Light that is coupled into a structure can be absorbed by the structure. The above-described differential coupling effect (different coupling for different polarization) depends on the wavelength of the light relative to the dimensions and the material of the structure. The difference in coupling can be applied to obtain a differential heating of elongate nanostructures oriented along longitudinal axes which are differently oriented one to the other (i.e. the structures are non-parallel) by exposing the structures to the same polarized light beam. In some embodiments, the first polarization plane can be oriented with respect to a first elongate structure at an angle $\alpha 1$ and with respect to a second elongate structure (non-parallel to the first) at an angle $\alpha 2$, with $\alpha 1$ not equal to $\alpha 2$. Provided that the wavelength of the light relative to the dimensions and the material of the structure is chosen judiciously, the two structures are then heated to different temperatures by exposure to the same light beam. The wavelength is high relative to the width of the elongate structure. According to an embodiment, the wavelength is between 10 and 30 times the width of the elongate structure. According to another embodiment, the wavelength is between 157 nm and 1060 nm. In some examples, the wavelength is chosen so that the energy of the light (in eV) is in close proximity to an energy value where the dielectric function of the material of the structure is at a maximum.

As stated, some embodiments can involve polarized light such that the polarization plane is parallel to one of the two structures. The two structures can be perpendicular to each other, in which case the difference in coupling and thereby the difference in heating is maximized. The heating is most pronounced in the structure oriented parallel to the polarization plane.

Embodiments in the present disclosure are applicable to a process wherein two fins are produced at a non-zero angle to each other (i.e. non-parallel fins) and of different materials, and wherein both fins are subjected to a dopant implant step followed by a dopant anneal performed according to the present disclosure, i.e. by exposing the two fins to a light beam that is polarized so that both fins are heated to different temperatures.

An example embodiment involves the processing of a Si fin and a Ge fin produced on the same substrate, the Si fin being non-parallel to the Ge fin, in some cases being perpendicular to the Ge fin. The expression "Si fin" and "Ge fin" are to be read in the present context as: fin consisting of Si or Ge at least in an upper layer of the fin. A "Ge fin" may for example consist of a Si portion with a SiGe buffer layer on top of it and a layer of strained Ge on top of the buffer layer. Doping elements are implanted in both the fins. A dopant anneal takes place by polarized light as described above, with the Si fin and Ge fin exposed simultaneously to the light. A suitable choice of the polarization with respect to the orientation of the Ge and the Si fins allows dopant activation in both fins by heating the fins, but wherein the Ge fin is heated to a lower temperature than the Si fin, thereby obtaining optimal dopant activation for both structures. In some examples, the polarization plane of the light is parallel to the Si fin. Example embodiments are applicable to other combinations of semiconductor materials, for example Si or Ge in one nanostructure and III-V material (such as GaAs, AlGaAs) in the other, or different III-V materials in different nanostructures.

As stated above, example embodiments allow for annealing two structures simultaneously at different temperatures. The method is however also applicable in multiple steps, wherein the substrate is rotated relative to the polarization plane in between the steps. This means that either the substrate is rotated or the light is polarized according to a plane that is rotated, in some cases perpendicularly oriented, with respect to the polarization plane in the first step. In each step, the light is applied with a given wavelength and polarization adapted to the configuration at hand. For example light of a first wavelength and first polarization is used in the first step and light of a second wavelength but still with the first polarization is used in the second step. If the fins are perpendicular fins of different materials, the first step may be applied with the polarization plane parallel to the first fin, the material of the first fin being suitable for coupling light of the first wavelength. The first step will thus heat up the first fin but not (or to a lesser extent) the second. If the material of the second fin is suitable for coupling light of the second wavelength, the second anneal step applied after 90° rotation of the fins will heat up only (or primarily) the second fin. The degree of coupling may be different at the two wavelengths, resulting in different heating during the first and second step.

Apart from a dopant anneal, the method may be applied for realizing a differential crystallization anneal of nano-scaled structures, i.e. annealing which induces a change in the crystal structure of the materials.

Apart from fin-shaped semiconductor structures, a method of the present disclosure is applicable to nano-scaled fibers or other elongate nanostructures, such as nanowires or nanofibers. The present disclosure is not limited to structures which have a given topology, such as fins or nano-fibers produced on top of a substrate, but also on nano-scaled elongate semiconductor areas of the same or different materials within a planarized substrate, i.e. areas which do not extend out of the substrate surface, but which are at the same level of the substrate surface.

While examples have been illustrated and described in detail in the drawings and foregoing description, such illustration and description are to be considered illustrative or exemplary and not restrictive. Other variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A method for manufacturing a semiconductor device, the method comprising:
   providing a semiconductor substrate;

producing, on the semiconductor substrate, at least one first elongate nanostructure oriented along a first axis and at least one second elongate nanostructure oriented along a second axis, the two axes being differently oriented one to the other;

heating the first and second nanostructures to different temperatures by (i) applying, to the first and second nanostructures at a first time, light having a wavelength and having a plane of polarization such that a difference in absorption of light occurs in the first and second nanostructures, thereby heating the first nanostructure to a first temperature, (ii) rotating the semiconductor substrate relative to the plane of polarization or rotating the plane of polarization relative to the semiconductor substrate, and (iii) after rotating the semiconductor substrate or the plane of polarization, applying the light to the first and second nanostructures at a second time, thereby heating the second nanostructure to a second temperature.

2. The method according to claim 1, wherein the first and second axes are perpendicular with respect to each other.

3. The method according to claim 1, wherein a polarization plane of the light is parallel to the first or second axis.

4. The method according to claim 1, wherein a polarization plane of the light is oriented with respect to the first nanostructure at a first angle, and with respect to the second nanostructure at a second angle, wherein the first angle and second angle are different.

5. The method according to claim 1, wherein the first nanostructure comprises a different material than a material of the second nanostructure.

6. The method according to claim 5, wherein the first and second nanostructures are semiconductor fins comprising mutually different semiconductor materials.

7. The method according to claim 6, wherein the semiconductor materials are chosen from a list comprising Si, Ge, SiGe, and III-V material.

8. The method according to claim 1, wherein the first and second nanostructures are nanotubes, nanowires or nanofibers.

9. The method according claim 1, wherein the wavelength of the light is between 10 and 30 times a width of the first or second elongate nanostructure.

10. The method according to claim 1, wherein the wavelength of the light is between 157 nm and 1060 nm.

11. The method according to claim 1, wherein the heating is applied for activating dopant elements implanted in the nanostructures.

12. The method according to claim 1, wherein the heating is applied for recrystallization of the nanostructures.

13. The method according to claim 1, wherein the wavelength of the light is selected based on a dielectric function of a material of the first or second nanostructure.

14. The method according to claim 13, wherein the wavelength of the light is selected to such that the dielectric function of a material of the first or second nanostructure is at a maximum.

15. The method according to claim 1, wherein one of the first and second nanostructures does not extend out of a surface of the semiconductor substrate.

16. The method according to claim 1, wherein the wavelength is a first wavelength, and wherein heating the elongate nanostructures to different temperatures further comprises:

after applying the light having the first wavelength at the first time, applying light having a second wavelength to the elongate nanostructures at the second time.

* * * * *